United States Patent [19]

Gramarossa et al.

[11] Patent Number: 4,775,046

[45] Date of Patent: Oct. 4, 1988

[54] TRANSPORT BELT FOR PRODUCTION PARTS

[75] Inventors: Daniel J. Gramarossa, Moorpark; Earl G. Baer, Garden Grove, both of Calif.

[73] Assignee: Future Automation, Inc., Simi Valley, Calif.

[21] Appl. No.: 819,674

[22] Filed: Jan. 17, 1986

[51] Int. Cl.[4] .............................................. B65G 17/20
[52] U.S. Cl. .................. 198/803.8; 198/678; 198/470.1; 294/99.1; 24/563; 118/423; 134/75; 134/128; 204/202
[58] Field of Search ............. 198/803.8, 468.01, 468.2, 198/469.1, 470.1, 803.2, 803.3, 803.7; 294/99.1, 99.2; 414/626; 204/198, 202; 118/423, 500, 501, 503; 134/48, 70, 75, 76, 85, 124, 128, 133, 134; 24/563, 545, 546, 552

[56] References Cited

U.S. PATENT DOCUMENTS

| | | |
|---|---|---|
| 1,188,206 | 4/1970 | Baldock et al. . |
| 1,318,053 | 10/1919 | Davoran . |
| 2,539,367 | 1/1951 | Greenberg ........................ 24/563 X |
| 2,919,705 | 1/1960 | Vitense . |
| 2,935,989 | 5/1960 | Arnold . |
| 3,878,062 | 4/1975 | Grimaldi et al. . |
| 4,078,982 | 3/1978 | Eidschun, Jr. . |
| 4,119,499 | 10/1978 | Eidschun, Jr. . |
| 4,155,815 | 5/1979 | Francis et al. . |
| 4,321,124 | 3/1982 | Audelo . |
| 4,534,843 | 8/1985 | Johnson et al. . |

Primary Examiner—Robert J. Spar
Assistant Examiner—Lyle Kimms
Attorney, Agent, or Firm—Seymour Rosenberg; Thomas Gunzler

[57] ABSTRACT

An improved transport belt is provided for gripping and carrying parts such as thin and fragile electronic components through production processes including, for example, electroplating steps and the like. The transport belt comprises an elongated upright web carrying a succession of depending gripper units, each including first and second fingers for gripping and carrying the production parts. The first finger is formed generally coplanar with the belt web, whereas the second finger has a generally U-shaped configuration with depending legs on the leading and trailing sides, respectively, of the first finger. The legs are deformed laterally from the plane of the belt web and interconnected at their lower ends by a cross bar which is urged by the legs into spring-loaded contact with the lower end or tip of the first finger. The fingers are separable at a loading station to permit insertion of a thin and/or fragile production part which is gripped, upon closure of the fingers, with directly opposed forces thereby avoiding part distortion as it is carried through production processes.

16 Claims, 2 Drawing Sheets

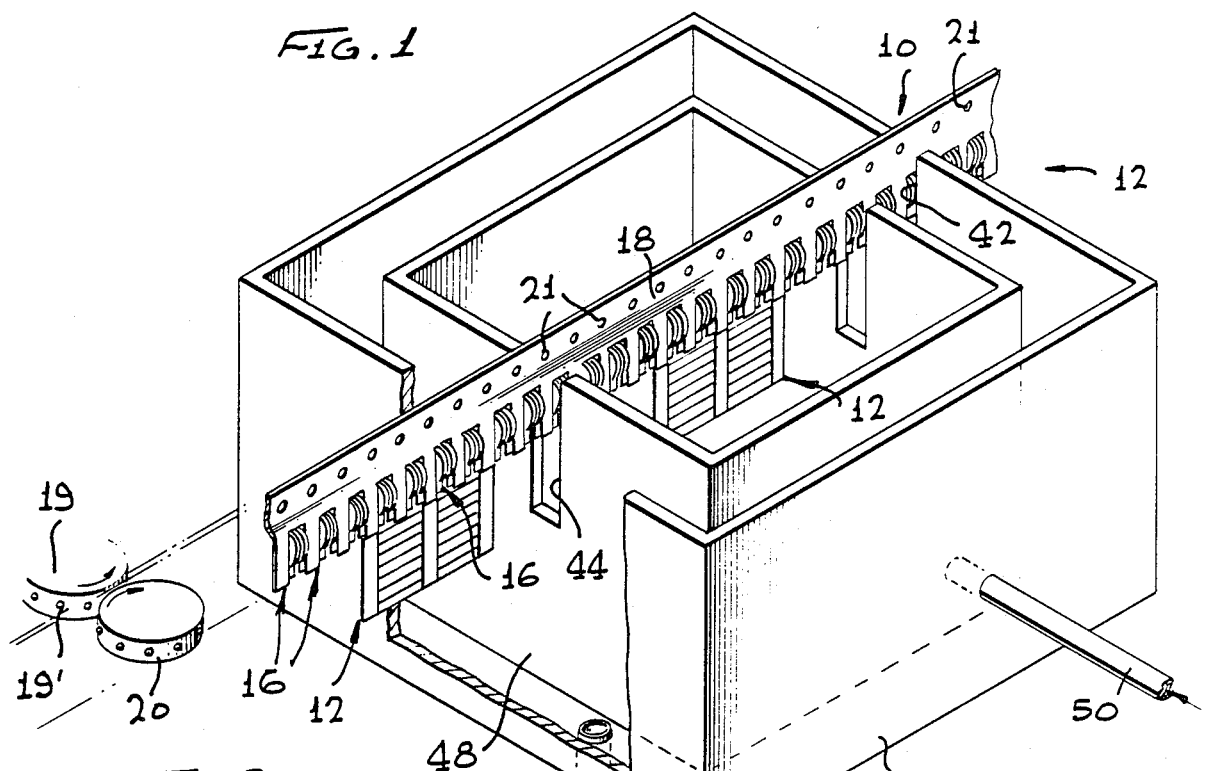
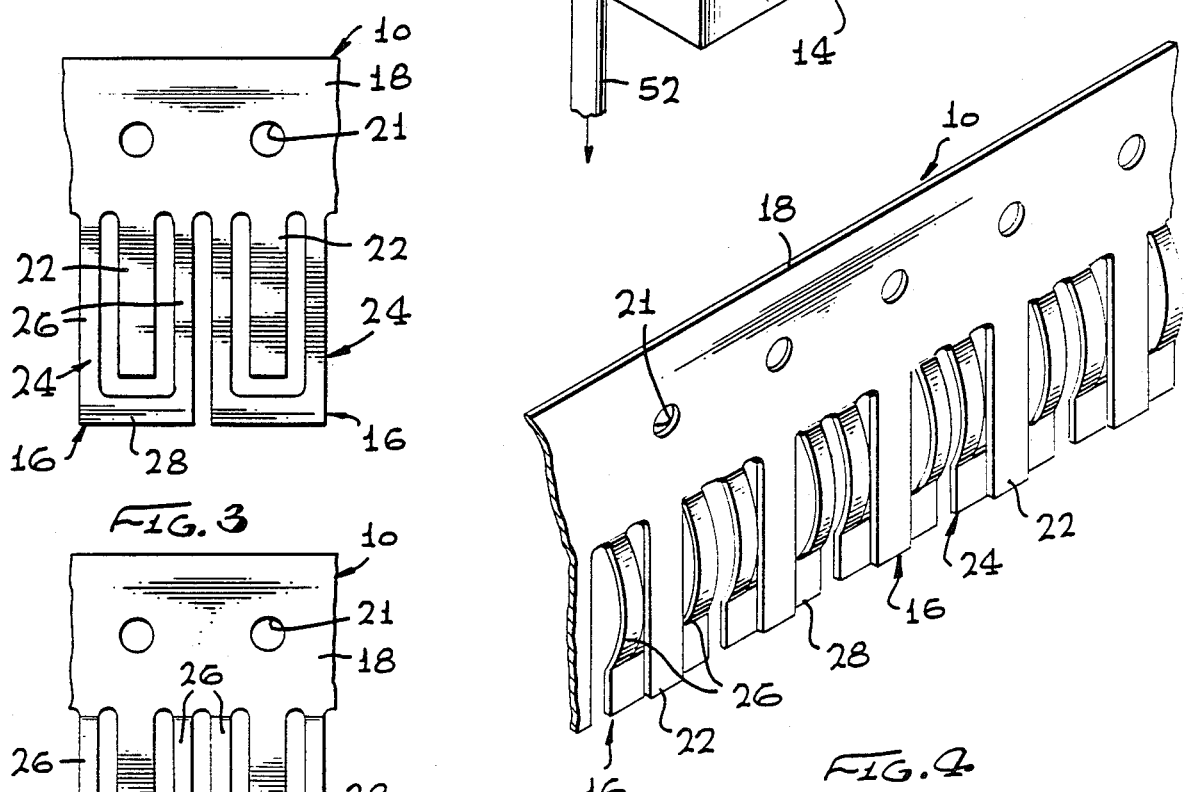

TRANSPORT BELT FOR PRODUCTION PARTS

BACKGROUND OF THE INVENTION

This invention relates generally to transport or conveyor devices for supporting and carrying production parts through production processes. More specifically, this invention relates to an improved transport belt for gripping and carrying relatively thin and/or fragile parts such as electronic components during production processes, for example, including electroplating steps and the like.

A variety of transport and/or conveyor devices are well known for use in automated or semi-automated transfer of production items between successive processing stations. For example, in many such devices, a transport belt is provided with gripping components for grasping and supporting production items as the belt is indexed to carry the production items through various processing steps. In one common form, the gripping components comprise clamp fingers connected to the transport belt and urged by springs toward engagement with each other thereby providing clamping forces to grip and hold the production parts. See, for example, U.S. Pat. No. 2,919,705. The belt is conveyed by suitable drive means past a loading station having means for opening the clamp fingers and inserting production parts therebetween, and an unloading station with means for removing processed parts from the clamp fingers.

In some production applications, simplified transport belt devices have been proposed including clamp or spring finger components formed integrally with a transport belt, thereby eliminating the need for separately mounted clamp finger components and associated springs. Such integral or unitary transport belt constructions have been formed from an elongated web of suitable spring material, such as stainless steel or the like, to provide a relatively cost-efficient belt device useful in gripping and carrying relatively small or lightweight production parts, particularly such as electronic components as they are carried, for example, through a sequence of electroplating or other production process steps. See, for example, U.S. Pat. No. 4,534,843. However, previous unitary transport belt devices have utilized a succession of spring fingers bent in opposite directions to engage a production part alternately on opposite sides thereof. This arrangement results in the application of unbalanced gripping forces which can distort relatively lightweight, thin, or flexible production parts, such as thin conductive contact components, thin circuit boards, foil elements, and the like.

There exists, therefore, a significant need for an improved transport belt including unitary gripping means for grasping and carrying production parts without applying unbalanced, potentially distorting forces to the production parts. The present invention fulfills these needs and provides further related advantages.

SUMMARY OF THE INVENTION

In accordance with the invention, an improved transport belt is provided for gripping and carrying production parts without applying potentially distorting gripping forces to the production parts. The transport belt comprises an elongated belt web formed to include a succession of depending gripper units each defined by a pair of fingers. The fingers are shaped for spring-loaded engagement with a marginal edge region of a production part with directly opposing balanced gripping forces thereby avoiding distortion of the production part as it is carried by the belt through production process steps.

In a preferred form of the invention, the improved transport belt is formed from spring material such as an elongated strip of stainless steel or the like formed into a continuous loop and appropriately driven through a machine or device one or more production process stations. The web of the belt is oriented generally in a vertical plane and is preferably formed integrally with the succession of depending gripper units.

Each gripper unit includes a first spring finger projecting downwardly from the web and having a generally flat geometry which may be substantially coplanar with the belt web. A second finger for each gripper unit has a generally U-shaped configuration defined by a pair of legs extending downwardly from the web at positions respectively proximate to leading and trailing sides of the first finger. These depending legs are interconnected at their lower ends by a cross bar formed generally in parallel with the belt web. Importantly, the depending legs are deformed in the lateral direction from the plane of the belt web and are shaped to form springs urging the associated cross bar into spring-loaded engagement with the lower end or tip of the first finger.

The improved transport belt, as described above, is indexed to a loading station including a stationary die block and a movable cam block on opposite sides of the belt web at positions spaced upwardly from the engaged lower ends of the fingers. The stationary die block supports the first finger against lateral displacement while the movable cam block is drawn against the deformed legs of the second finger and in a direction displacing the cross bar laterally away from the first finger. The lower ends of the two fingers are thus separated to permit automated or semi-automated insertion of a production part therebetween, followed by a reverse displacement of the movable cam block, thereby permitting closure of the fingers in directly opposed, force-balanced engagement with the production part. The transport belt is then operable to index the production part through one or more process stations and further to an unloading station having a similarly operated stationary die block and movable cam block for opening the fingers to release the production part.

The belt web and gripper units are advantageously formed from a unitary elongated strip of the selected spring material, wherein the strip is initially formed with the U-shaped second finger of each gripper unit supporting the cross bar in a position spaced below the associated first finger. The legs of the second finger are then deformed by stamping or the like to reposition the cross bar in side-by-side spring-loaded contact with the lower end or tip of the first finger.

Other features and advantages of the present invention will become more apparent from the following detailed description, taken in conjunction with the accompanying drawings which illustrate, by way of example, the principles of the invention.

BRIEF DESCRIPTION OF THE DRAWINGS

The accompanying drawings illustrate the invention. In such drawings:

FIG. 1 is a fragmented perspective view illustrating a transport belt embodying the novel features of the invention and shown in operation for carrying production parts through an electroplating process station;

FIG. 2 is an enlarged fragmented side elevation view depicting an elongated precut blank strip for use in forming the transport belt;

FIG. 3 is a fragmented side elevation view similar to FIG. 2 but illustrating the formed transport belt;

FIG. 4 is a fragmented perspective view illustrating the transport belt;

DETAILED DESCRIPTION OF THE PREFERRED EMBODIMENT

Figure 5A:
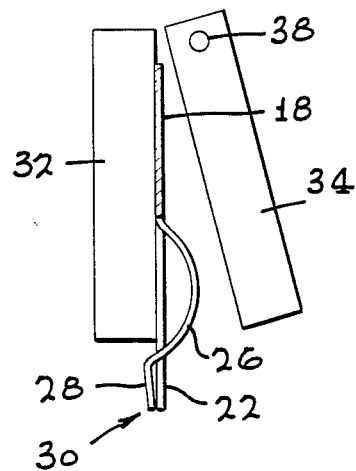
FIGS. 5a through 5c comprise somewhat schematic end views depicting operation of a loading station for loading production parts onto the belt.

As shown in the exemplary drawings, an improved transport belt referred to generally by the reference numeral 10 is provided for gripping and carrying a succession of production parts 12 through one or more production process stations, with a plating station 14 being depicted by way of example in FIG. 1. The transport belt 10 includes a succession of gripper units 16 designed for supporting the production parts 12 with directly opposed, balanced gripping forces thereby preventing distortion of or damage to lightweight or flexible production parts.

The transport belt 10 of the present inention advantageously provides a relatively simple and preferably one-piece belt construction designed for gripping and transporting a wide variety of production parts 12 in a secure and stable manner. For example, as depicted in FIG. 1, the transport belt is particularly adapted for use in carrying thin, lightweight, and/or fragile production parts such as encapsulated electronic components known as P-Dip strips through a succession of electroplating process steps. The gripper units 16 provide clamping forces which act upon the production parts 12 in direct and balanced opposition, thereby avoiding unbalanced clamping forces which can otherwise distort or damage lightweight production parts. Moreover, the transport belt 10 of the present invention can be used with a wide range of other production parts including, for example thin foil or other flexible parts.

As depicted in FIG. 1, the transport belt 10 is formed from a single elongated strip to include a belt web 18 oriented generally in a vertical plane and carrying the depending gripper units 16. As is known in the art, the belt web 18 is normally formed into a continuous belt loop wrapped about appropriate pulleys or the like (not shown) and associated with suitable drive means such as the illustrative drive wheels 19 and 20 depicted in FIG. 1. The drive wheels advance the belt continuously or in indexed steps along a prescribed path with at least part of the belt in operative association with one or more production process stations, such as the plating station 14. Spaced drive holes 21 may be formed in the web 18 for reception of sprocket teeth 19' on the drive wheel 19 to insure accurate belt driving control, as desired.

In the preferred form, the transport belt 10 is constructed from an elongated strip of spring material, such as stainless steel or the like, which is cut and shaped by stamping or the like to form the gripper units 16. More particularly, as shown best in FIG. 2, the elongated belt strip is cut to define the web 18 in a common plane with partially formed gripper units 16. Each of the partially formed gripper units 16 comprises a pair of fingers depending from the web 18. As initially cut from the blank strip, a first finger 22 has a straight and flat shape lying generally coplanar with the web 18. A second, partially formed finger 24 is also initially cut to have a flat geometry generally coplanar with the belt web 18. However, this second finger 24 is generally U-shaped to surround the first finger 22 by means of two legs 26 extending downwardly from the web 18 respectively at the leading and trailing sides of the first finger 22, and interconnected at their lower ends by a short cross bar 28 disposed below the first finger 22.

As shown in FIGS. 3 and 4, the legs 26 of the partially formed second finger on each gripper unit 16 are deformed by stamping or the like to a position laterally offset from the plane of the belt web 18. In the preferred shape, the legs 26 are re-shaped to an arcuate configuration curving laterally away from and then back toward the web. The specific shapes of the legs 26 are chosen to elevate the lower cross bar 28 for side-by-side contact with the lower end or tip of the first finger 22 with both fingers having lower end margins terminating in the same plane. Importantly, the lower ends of the legs 26 are joined to the cross bar 28 on the lateral side of the web opposite the curved legs and the legs 26 are deformed to act as springs drawing the cross bar 28 with a selected spring force against the first finger 22. Accordingly, in the absence of a production part, the lower ends or tips of the fingers 22 and 24 are urged into direct contact with one another.

In use in a production operation, the transport belt 10 is associated with a loading station 30 as depicted generally in FIGS. 5a–5c and 6 to facilitate automated or semi-automated insertion of the production parts 12 to be carried by the belt. At the loading station, a portion of the belt 10 is indexed to a position between an upright stationary die block 32 and a movable cam block 34 on opposite lateral sides of the belt. The cam block 34 is suspended from above by a support structure 36 (FIG. 6) for pivoting movement about longitudinally extending pivot pins 38. An actuator 40 (FIG. 6) is suitably connected to the cam block 34 for displacing the cam block 34 in a direction opening or closing the fingers 22 and 24.

Figure 5B:
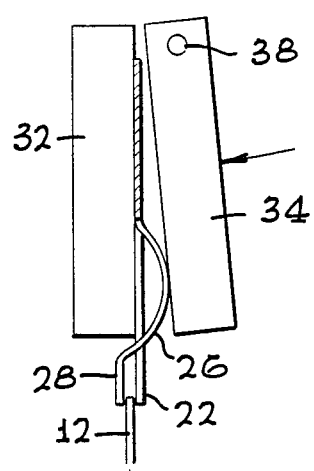
Figure 5C:
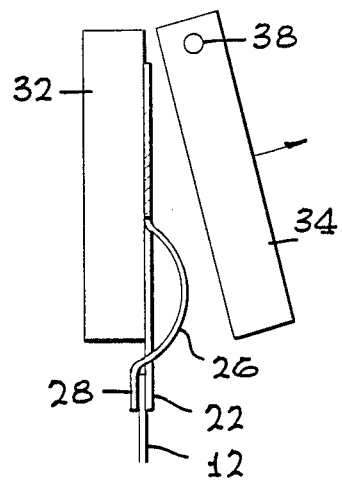

More specifically, the engaged lower ends of the fingers 22 and 24 are positioned below the die and cam blocks 32 and 34 at the loading station 30. An upper portion of the flat-shaped first finger 22 lies abutting on the stationary die block 32 to prevent lateral motion of the finger 22 in the direction of the die block 22. The deformed legs 26 of the second finger 24 protrude laterally away from the die block 32 and terminate with lower ends disposed below the die and cam blocks. Closing motion of the movable cam block 34 upon extension of the illustrative actuator 40 functions to displace the cam block against the spring legs 26 thereby pressing the cross bar 28 laterally away from the first finger 22. As a result, the fingers 22 and 24 are opened to permit insertion of a production part 12 therebetween, as shown in FIG. 5b. With the production part inserted, the cam block 34 is returned to its original position by reverse actuator motion, whereupon the fingers securely grip the part with directly opposed and balanced grip forces. The belt 10 can be indexed to the next and subsequent positions transferring the suspended part 12 through one or more production processes. In addition, subsequent parts 12 can be loaded onto the belt 10 as previously loaded parts are subjected to production processes.

The invention is particularly useful in carrying production parts such as electronic components through electroplating steps as shown by way of example in FIG. 1. That is, the transport belt 10 supports the production parts in a secure and stable manner for conveyance through aligned access openings 42 and 44 formed respectively in an outer drain tank 46 and an inner plating tank 48. A suitable electroplating solution is pumped into the plating tank 48 via an inflow conduit 50 to overflow the plating tank, with the drain tank 46 collecting the solution for return circulation via a recirculation conduit 52.

Figure 6:
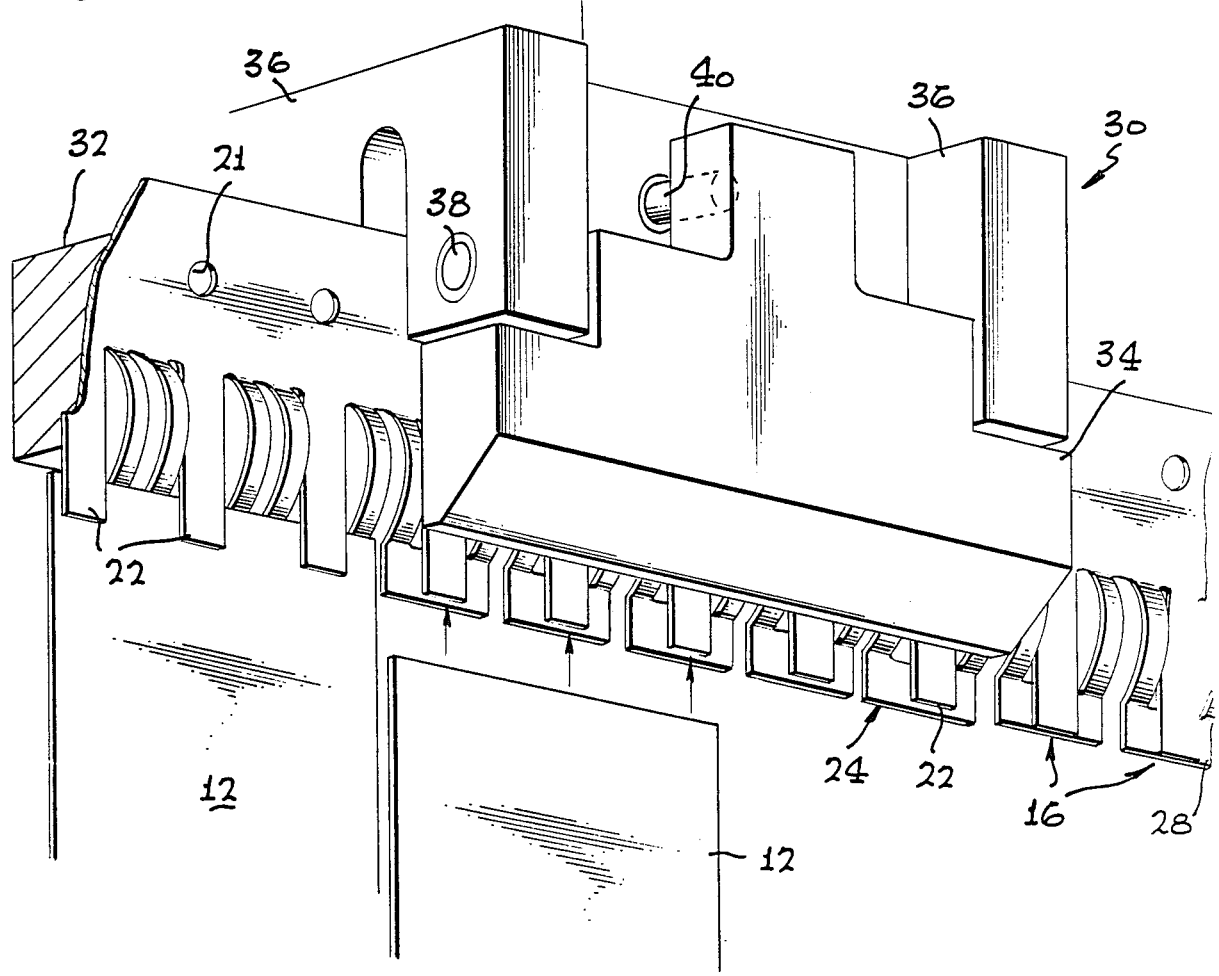
FIG. 6 is an enlarged fragmented perspective view illustrating operation of the loading station.

After completion of the production process or processes, the transport belt 10 is indexed into association with an unloading station which, although not shown in the drawings, can be formed with a structure corresponding with the loading station 30 depicted in FIGS. 5 and 6. With such construction, a movable cam block at the unloading station can be displaced against the deformed legs 26 for opening the fingers, thereby releasing the processed production part 12.

The improved transport belt 10 of the present invention thus provides a relatively simple device formed advantageously as a one-piece construction with the fingers 22 and 24 securely gripping the production parts. The gripping forces act in direct opposition to one another, thereby completely avoiding unbalanced gripping forces which can otherwise distort or damage thin or fragile production parts.

A variety of modifications and improvements to the invention described herein are believed to be apparent to those skilled in the art. Accordingly, no limitation on the invention is intended by way of the description, except as set forth in the appended claims.

What is claimed is:

1. A transport belt for gripping and carrying a production part through one or more production process steps, said transport belt comprising:
   a generally upright belt web; and
   a gripper unit including a first finger depending from said web and a generally U-shaped second finger defined by a pair of legs depending from said web respectively at the leading and trailing sides of said first finger and a cross bar connected between the lower ends of said legs, said legs defining springs for urging said cross bar into engagement with the lower end of said first finger whereby the production part is receivable between said first finger lower end and said cross bar which apply directly opposed grip forces thereto.

2. The transport belt of claim 1 including a succession of said gripper units depending from said web.

3. The transport belt of claim 1 wherein said gripper unit is formed integrally with said web.

4. The transport belt of claim 3 wherein said web and said gripper unit are formed from an elongated strip of a spring material.

5. The transport belt of claim 4 wherein said spring material is stainless steel.

6. The transport belt of claim 3 wherein said legs extend from said web downwardly and laterally outwardly on a first lateral side of said first finger and have lower ends connected to said cross bar on a second lateral side of said first finger, said legs being shaped to draw said cross bar against said first finger lower end.

7. The transport belt of claim 1 further including drive means for advancing said belt, loading means for opening and closing said gripper unit for reception of a production part between said first and second fingers, and unloading means for opening and closing said gripper unit for removal of the loaded production part from between said first and second fingers.

8. A transport belt for gripping and carrying a production part through one or more production process steps, said transport belt comprising:
   a generally upright belt web; and
   a gripper unit including first and second fingers formed integrally with and depending from said web, and means for urging the lower ends of said first and second fingers into engagement with each other whereby the production part is receivable between said first and second finger lower ends which apply directly opposed forces thereto; said first finger is formed generally coplanar with said web, and wherein said second finger has a generally U-shaped construction including a pair of legs depending from said web respectively at the leading and trailing sides of said first finger and a cross bar connected between the lower ends of said legs, said legs defining springs for urging said cross bar into engagement with the lower end of said first finger.

9. The transport belt of claim 8 including a succession of said gripper units depending from said web.

10. The transport belt of claim 8 wherein said web and said gripper unit are formed from an elongated strip of a spring material.

11. The transport belt of claim 8 wherein said legs extend from said web downwardly and laterally outwardly on a first lateral side of said first finger and have lower ends connected to said cross bar on a second lateral side of said first finger, said legs being shaped to draw said cross bar against said first finger lower end.

12. A transport belt for gripping and carrying a production part through one or more production process steps, said transport belt comprising:
   a generally upright belt web; and
   a succession of gripper units depending from said web and formed integrally therewith, each of said gripper units including a first finger depending from said web, and a generally U-shaped second finger having a pair of spring legs depending from said web respectively at the leading and trailing sides of said first finger, said second finger further including a cross bar connected between the lower ends of said spring legs and urged by said spring legs into lateral engagement with the lower end of said first finger whereby the production part is receivable between said first finger lower end and said cross bar which apply directly opposed grip forces thereto.

13. The transport belt of claim 12 wherein said first finger is formed generally coplanar with said web.

14. The transport belt of claim 13 wherein said wherein said legs extend from said web downwardly and laterally outwardly on a first lateral side of said first finger and have lower ends connected to said cross bar on a second lateral side of said first finger, said legs being shaped to draw said cross bar against the first finger lower end.

15. A system for transporting and carrying production parts in succession through one or more production process steps, said system comprising:
   a continuous loop transport belt having a generally upright belt web and a succession of integrally formed, depending gripper units, each of said gripper units including a first finger depending from said web, and a generally U-shaped second finger having a pair of spring legs depending from said web respectively at the leading and trailing sides of said first finger, said second finger further including a cross bar connected between the lower ends of said spring legs and urged by said spring legs into lateral engagement with the lower end of said first finger whereby the production part is receivable between said first finger lower end and said cross bar which apply directly opposed grip forces thereto;

a loading station including means for opening and closing said first and second fingers of said gripper units to load the production parts onto said gripper units;

at least one production process station;

an unloading station including means for opening and closing said first and second fingers of said gripper units to unload the production parts therefrom; and drive means for advancing said transport belt in operative relation with said loading station, said at least one process station, and said unloading station.

16. The system of claim 15 wherein said process station is a parts plating station.

* * * * *